(12) United States Patent
Hou et al.

(10) Patent No.: US 8,965,550 B2
(45) Date of Patent: Feb. 24, 2015

(54) EXPERIMENTS METHOD FOR PREDICTING WAFER FABRICATION OUTCOME

(75) Inventors: Hsin-Ming Hou, Tai-Nan (TW); Ji-Fu Kung, Taichung (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 425 days.

(21) Appl. No.: 13/287,097

(22) Filed: Nov. 1, 2011

(65) Prior Publication Data

US 2013/0110272 A1 May 2, 2013

(51) Int. Cl.
| | |
|---|---|
| G06F 19/00 | (2011.01) |
| G05B 11/01 | (2006.01) |
| G05B 13/02 | (2006.01) |
| H01L 21/00 | (2006.01) |
| G01R 31/26 | (2014.01) |
| H01L 21/66 | (2006.01) |

(52) U.S. Cl.
CPC ..................................... G06F 19/00 (2013.01)
USPC ............... 700/104; 700/21; 700/51; 700/91; 700/110; 700/121; 438/10; 438/14; 438/16; 438/800

(58) Field of Classification Search
CPC ..................................................... G06F 19/00

USPC ................... 700/104, 121, 51, 91; 438/14
See application file for complete search history.

(56) References Cited

U.S. PATENT DOCUMENTS

| | | | |
|---|---|---|---|
| 6,687,558 B2 | 2/2004 | Tuszynski | |
| 6,723,574 B1* | 4/2004 | Bailey et al. | 438/16 |
| 7,072,808 B2 | 7/2006 | Tuszynski | |
| 7,239,991 B2 | 7/2007 | Tuszynski | |
| 7,672,745 B1* | 3/2010 | Tuszynski | 700/97 |
| 2005/0075750 A1* | 4/2005 | Sun | 700/121 |
| 2007/0105244 A1* | 5/2007 | Okita | 438/14 |
| 2008/0059143 A1* | 3/2008 | Chiu et al. | 703/14 |
| 2008/0140330 A1 | 6/2008 | Morioka | |

* cited by examiner

*Primary Examiner* — Mohammad Ali
*Assistant Examiner* — Yuhui R Pan
(74) *Attorney, Agent, or Firm* — Winston Hsu; Scott Margo

(57) ABSTRACT

A wafer fabrication outcome, such as wafer yield or wafer lifetime, is predicted by excluding uncontrollable but measurable internal/external noises of a DOE system, and by rendering relations between wafer design variables and wafer outcome outputs to be more causal, as well as the relations between variances for each of the wafer design variables and the wafer outcome outputs. With the aid of a wafer fabrication outcome predicting model formed by the more causal relations, precision of predicting wafer outcomes can be raised, and performance of wafer fabrication can be thus raised as a result.

9 Claims, 6 Drawing Sheets

EXPERIMENTS METHOD FOR PREDICTING WAFER FABRICATION OUTCOME

BACKGROUND OF THE INVENTION

1. Field of the Invention

The present invention discloses a design of experiments (DOE) method for predicting wafer fabrication outcomes, and more particularly, for a DOE method of establishing a correlation-suppressing and causal wafer fabrication outcome predicting model.

2. Description of the Prior Art

In conventional wafer fabrication procedures, yield of fabricated wafers is highly monitored for improvements. Moreover, the yield may be predicted by observing data generated by fault detection and classification machine sensors which are responsible for detecting defects of the fabricated wafers.

However, there are uncontrollable variables, i.e., noises, in yield prediction, for example, noises caused by temperature, humidity, and etc. If the noises are not well handled, the noises will not be convergent so that precision of the yield prediction will be decreased significantly.

SUMMARY OF THE INVENTION

The claimed invention discloses a design of experiments (DOE) method for predicting a wafer fabrication outcome. The DOE method comprises establishing a plurality of first correlation-suppressing relations between each of a plurality of design variables and each of a plurality of first outputs, establishing a plurality of second correlation-suppressing relations between each of a plurality of variances of each of the plurality of design variables and each of the plurality of first outputs, extracting a correlation-suppressing plurality of second outputs from the plurality of first outputs, by using a 3-sigma analysis, establishing a plurality of first causality relations between each of the plurality of wafer design variables and each of the plurality of second outputs, and establishing a plurality of second causality relations between each of the plurality of variances of each of the plurality of wafer design variables and each of the plurality of second outputs. Both the plurality of first outputs and the plurality of second outputs are utilized for indicating wafer fabrication outcomes of a DOE system, and both the plurality of first causality relations and the plurality of second causality relations are utilized for predicting a wafer fabrication outcome.

These and other objectives of the present invention will no doubt become obvious to those of ordinary skill in the art after reading the following detailed description of the preferred embodiment that is illustrated in the various figures and drawings.

DETAILED DESCRIPTION

For preventing the yield prediction in the wafer fabrication from being effected by noises, the present invention discloses a design of experiments (DOE) method for predicting wafer fabrication outcomes, such as wafer yield and wafer lifetime. The DOE method of the present invention is primarily utilized for retrieving causality relations between different fabrication domains in a whole wafer fabrication procedure conducted by a DOE system, where effects of internal/external uncontrollable variables, i.e. errors, are also excluded from the causality relations by using the disclosed DOE method.

There are controllable variables and uncontrollable variables in wafer yield predictions, and the uncontrollable variables may be introduced in relations between different wafer fabrication domains. The uncontrollable variables include external uncontrolled variables and internal uncontrollable variables. The external uncontrollable variables, which are indicated as external noises as well, are external to the DOE system but still measurable or quantifiable. The internal uncontrollable variables, which are indicated as internal noises as well, are internal to the DOE system but still measurable or quantifiable.

The disclosed method of the present invention roughly includes the following steps: (a) establishing wafer design variables by using DOE-based techniques; (b) determining variances for each of the picked wafer design variables; (c) measuring outputs generated according to the picked wafer design variables and the determined variances for each of the picked wafer design variables; (d) performing a correlation-suppressing procedure to induct relations between the outputs and the picked wafer design variables in considerations of the determined variances, where effects of internal uncontrollable variables on the relations are suppressed within three standard deviations (i.e. sigma) of the picked design variables; and (e) performing a causality procedure to suppress effects of both internal and external uncontrollable variables on the relations within and outside the three standard deviations of the picked design variables. Note that implementation of the step (d) may be referred to a hierarchical wafer yield/lifetime predicting method disclosed in U.S. patent application Ser. No. 13/225,495, which shares same inventors as the present invention, according to one embodiment of the present invention.

Figure 1:
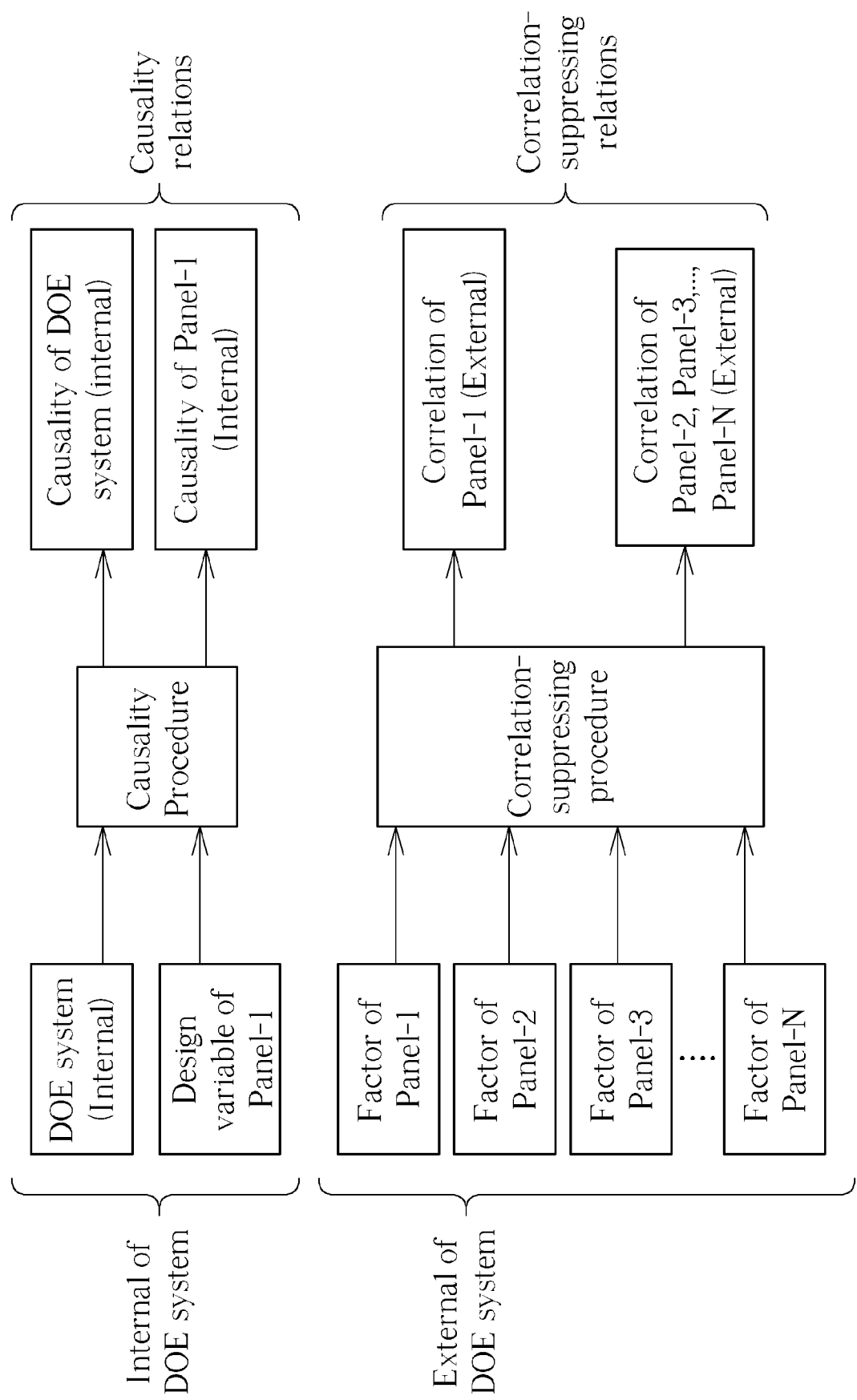
FIG. 1 illustrates a simplified flowchart of the DOE method of the present invention.

Please refer to FIG. 1, which illustrates a simplified flowchart of the DOE method of the present invention. When performing the DOE method, there will be a DOE system and a plurality of panels utilized for wafer fabrication, such as the panels Panel-1, Panel-2, Panel-3, . . . , and Panel-N, where the DOE system is configured to measure parameters of one of the above-listed panels for performing wafer property prediction on the measured panel. Assume that the purpose of dispositions in FIG. 1 is to reduce effects of internal noises and external noises of the DOE system on the panel Panel-1. There are two primary procedures in the DOE methods, the first one is the abovementioned correlation-suppressing procedure in the step (d), and the second one is the abovementioned causality procedure in the step (e).

As can be observed in FIG. 1, external noises from panels other than the panel Panel-1 and from external environment of the DOE system are quantified in the correlation-suppressing procedure so as to quantify correlation between the panel Panel-1 and the other panels and correlation between the panel Panel-1 and external factors of the DOE system.

Internal noises of the DOE system having effects on the panel Panel-1 include noises from the DOE system itself and noises from the panel Panel-1 within. The internal noises are quantified in the causality procedure so as to quantify a casual relation between design variables of the panel Panel-1 and outputs of the panel Panel-1.

Figure 2:
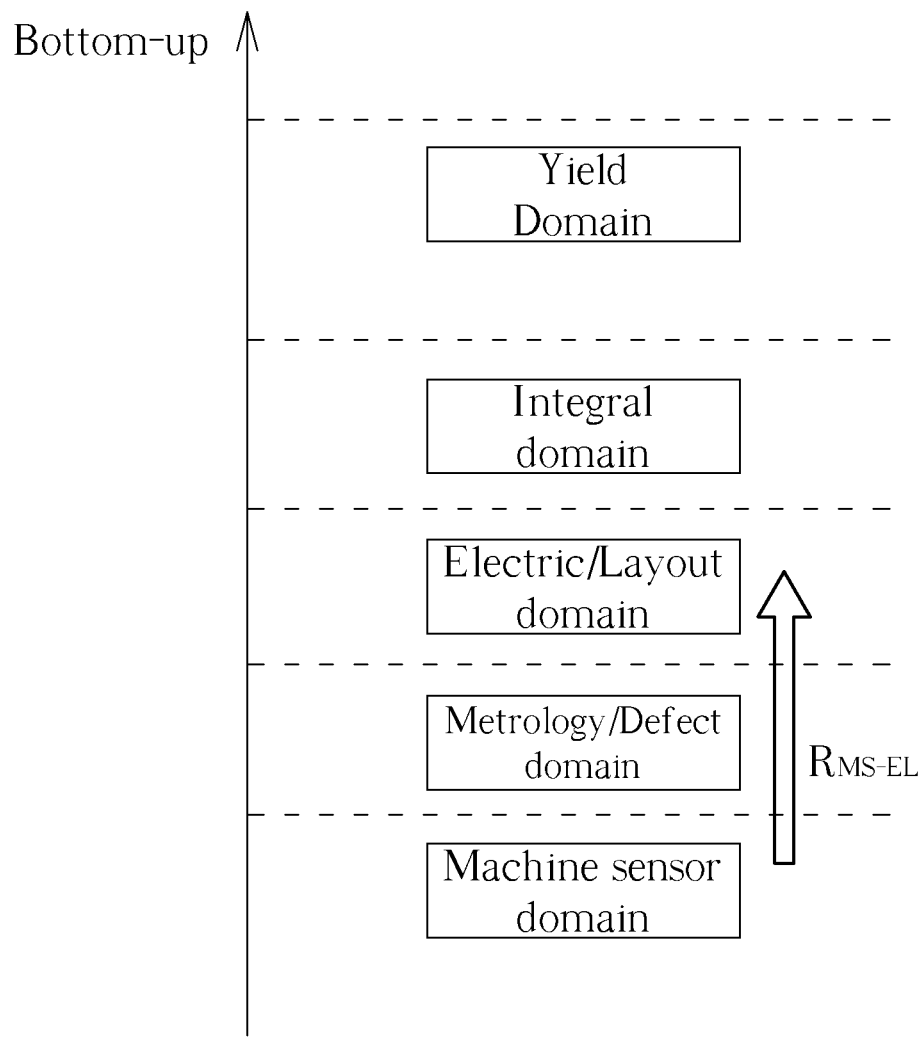
FIG. 2 exemplarily illustrates a plurality of fabrication domains in a whole wafer fabrication procedure according to one embodiment of the present invention.

Please refer to FIG. 2, which exemplarily illustrates a plurality of fabrication domains in a whole wafer fabrication procedure according to one embodiment of the present invention, where each of the plurality of fabrication domains may be corresponding to different types of design variables. Note that FIG. 2 of the present invention can be regarded as variation of FIG. 1 and FIG. 2 shown in U.S. patent application Ser. No. 13/225,495 so that the concept of hierarchy may also be utilized in FIG. 2 of the present invention. FIG. 2 illustrates fabrication domains including a wafer fabrication outcome domain, an integral domain, an electric/layout domain, a metrology/defect domain, and a machine sensor domain in the whole wafer fabrication procedure of a panel, where the wafer fabrication procedure goes in a bottom-up manner through the above-listed fabrication domains for causality requirements, in comparison of the top-down manner utilized in U.S. patent application Ser. No. 13/225,495. Note that the lower fabrication domain is closer to the beginning of the whole fabrication procedure, and the upper fabrication domain is closer to the end of the fabrication procedure. When performing the DOE method of the present invention on a panel, a pair of the above-listed fabrication domains is picked so that relations between the pair of picked fabrication domains can be inducted, where one of the picked fabrication domain is determined as an input domain, and the other one of the picked fabrication domain is determined as an output domain. For example, if the electric/layout domain and the machine sensor domain are picked, a relation $R_{MS-EL}$ from the machine domain to the electric/layout domain will be inducted by using the DOE method of the present invention, where the electric/layout domain serves as the output domain of the relation $R_{MS-EL}$, the machine sensor domain serves as the input domain of the relation $R_{MS-EL}$.

Note that the fabrication domains are merely exemplary domains in the whole wafer fabrication procedure. In other embodiments of the present invention, other types of wafer fabrication domains can also be utilized for determining relations in between to enhance precision of the relations between the fabrication domains, i.e. to render the relations to be more causal.

Figure 3:
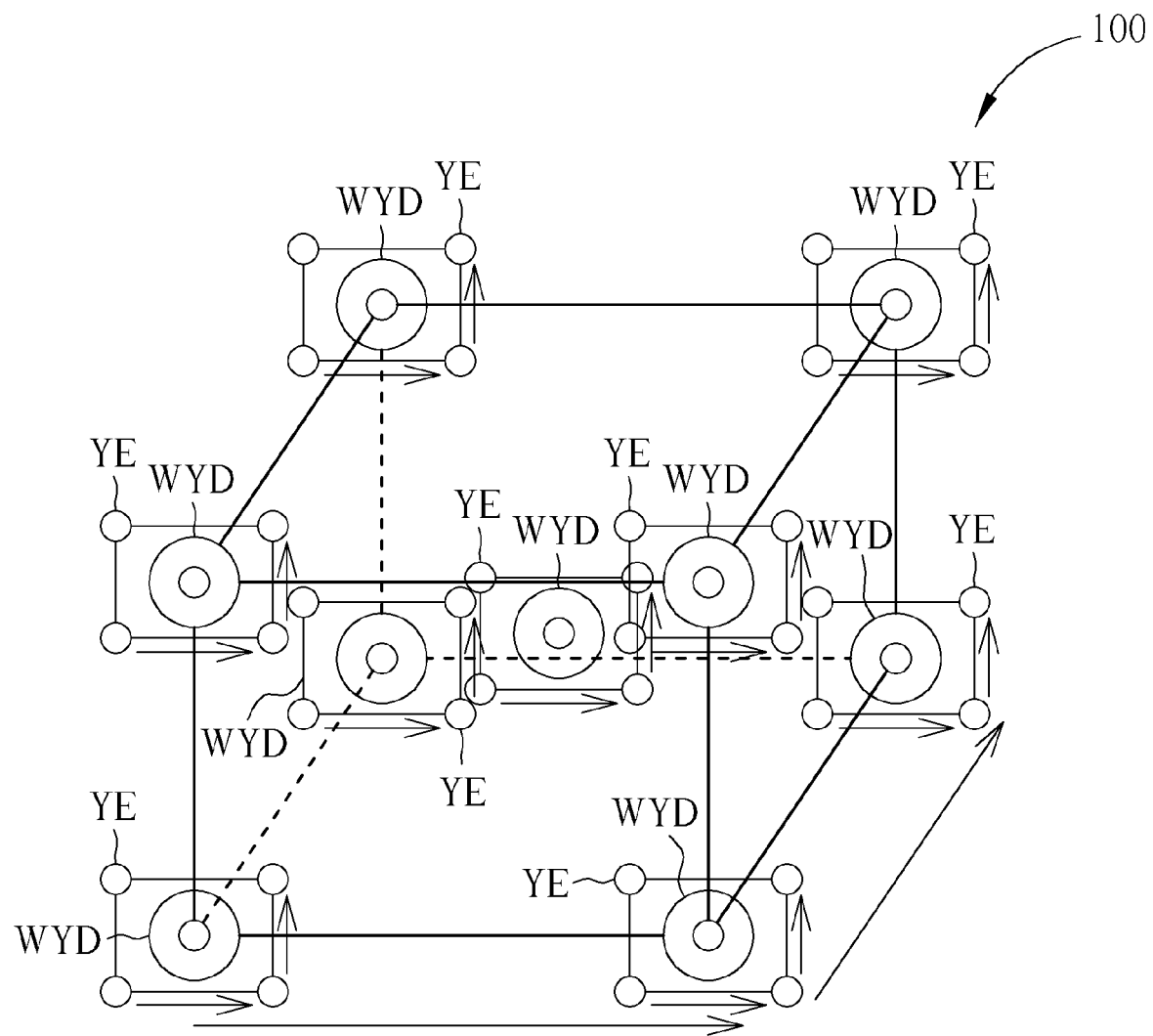
FIG. 3 illustrates a DOE-based model for wafer yield prediction according to one embodiment of the present invention.

Please refer to FIG. 3, which illustrates a DOE-based model 100, which may also be regarded as a DOE-based wafer yield profile, for wafer yield prediction of a panel according to one embodiment of the present invention. FIG. 3 also refers to the above-mentioned steps (a) and (b). It is assumed that three factors of a panel measured by a DOE system are considered as three dimensions of a specific wafer design variable for predicting the wafer yield, so that nine wafer design variables WYD are established, as indicated by the above-mentioned step (a), where eight of the wafer design variables WYD are located at corners of a cubic model indicated by the DOE-based model 100, and the other one of the wafer design variables WYD is located at the center of the cubic model.

The factors forming a wafer design variables WYD may be temperature, humidity, or pressure according to one embodiment of the present invention.

After establishing the wafer design variables, a plurality of variances for each of the wafer design variables WYD is then established corresponding to variation of the three factors, as indicated by the above-mentioned step (b). As shown in FIG. 2, each of the wafer design variables WYD is surrounded by a plurality of variance variables YE for indicating different ranges of each of the wafer design variables WYD, where the different ranges correspond to slightly-different values of the three factors; for example, suppose an output indicated by one wafer design variable WYD is $F(X, Y, Z)$, where $F(\bullet)$ indicates the relation from an input domain to an output domain and refers to an intermediate fabrication procedure within the whole wafer fabrication procedure, outputs indicated by the plurality of variance variables YE may include $F(X+\Delta X, Y, Z)$, $F(X-\Delta X, Y, Z)$, $F(X, Y+\Delta Y, Z)$, $F(X, Y-\Delta Y, Z)$, $F(X, Y, Z+\Delta Z)$, and $F(X, Y, Z-\Delta Z)$.

After completing the above-mentioned steps (a) and (b), outputs corresponding to the plurality of wafer design variables WYD and respective surrounding variance variables YE can be generated, as indicated by the above-mentioned step (c).

Figure 4:
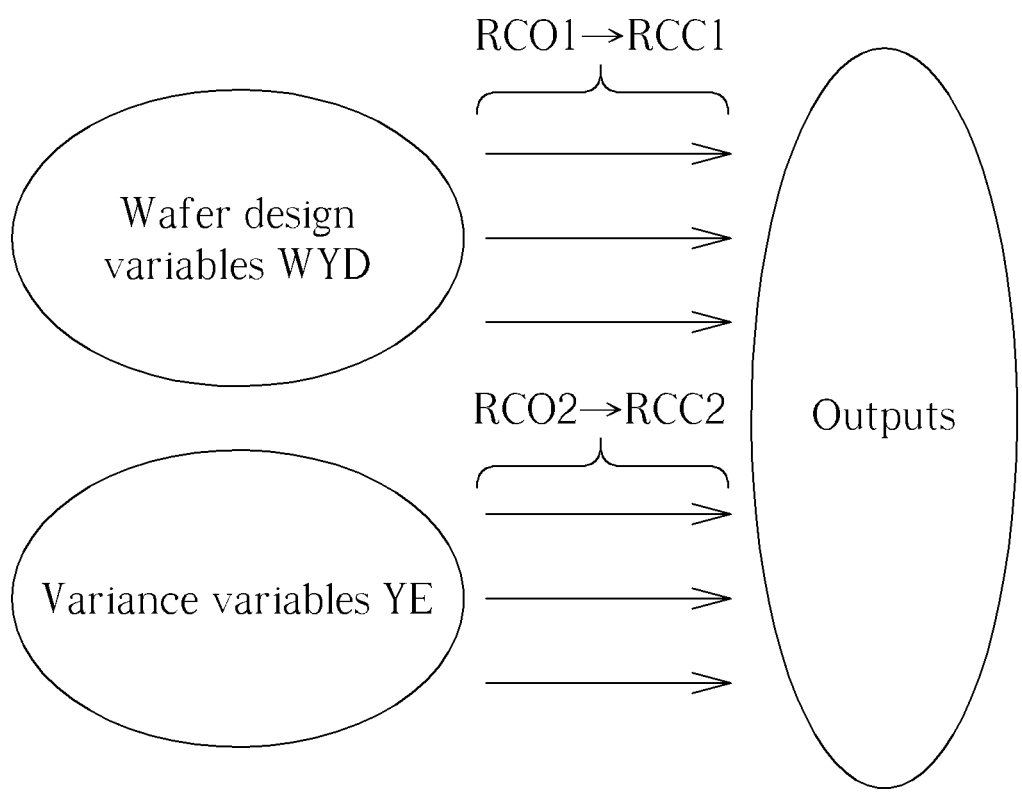
FIGS. 4-5 schematically illustrates relations between a plurality of wafer design variables and a plurality of outputs and relations between the plurality of variances for each of the plurality of wafer design variables, in view of sets and mapping between sets for explaining a correlation-processing procedure and a causality procedure of the disclosed DOE method.

Please refer to FIG. 4, which schematically illustrates relations RCO1 between the plurality of wafer design variables WYD of a panel and the plurality of outputs and relations RCO2 between the plurality of variance variables YE for each of the plurality of wafer design variables WYD, in view of sets and mapping between sets for explaining the correlation-processing procedure of the disclosed DOE method. Note that the relations RCO1 and RCO2 include significant effects from internal/external noises of the DOE system. As shown in FIG. 4, the relations RCO1 and RCO2 can be easily inducted when values of the plurality of wafer design variables WYD, the plurality of variance variables YE for each of the plurality of wafer design variables WYD, and the outputs are known. However, the relations RCO1 and RCO2 are affected by the above-mentioned internal and external noises. A primary purpose of the disclosed DOE method is to significantly reduce the internal and external noises of the DOE system having effects on both the relations RCO1 and RCO2, so as to raise precision of the relations RCO1 and RCO2. As long as the relations RCO1 and RCO2 are precise enough, predictions of wafer fabrication outcomes will also be precise.

First, the above-mentioned correlation-suppressing procedure is utilized for weakening effects of internal uncontrollable variables on the relations RCO1 and RCO2, as indicated by the above-mentioned step (d). In the correlation-suppressing procedure, according to one embodiment of the present invention, a principal component analysis (PCA) or a partial least square (PLS) analysis can be used for determining a first set of relations RCC1 between the plurality of wafer design variables WYD and the outputs measured in the step (c) and for determining a second set of relations RCC2 between the variance variables YE for each of the plurality of wafer design variables WYD and the outputs measured in the step (c), where both the PCA or the PLS analysis are three-sigma analyses; as a result, noises introduced by correlations between wafer design variables WYD and internal uncontrollable variables can be significantly reduced in both the relations RCC1 and RCC2, according to one embodiment of the present invention, and a set of correlation-suppressing outputs, which stands for a correlation-suppressing subset of the outputs generated in the step (c), can be extracted from the plurality of outputs by using the above-mentioned 3-sigma analyses as well. The internal noises within three standard deviations of outputs corresponding to the plurality of design variables can be significantly discarded in the relations RCC1 and RCC2. Besides, with the aid of the correlation-suppressing procedure, the following causality procedure can be immune from unnecessary correlations between the wafer design variables WYD and the internal uncontrollable variables so that a large amount of processing in the following causality procedure can be saved. Note that in view of causality, the relations RCC1 are more causal than the relations RCO1 since the inner noises are reduced, and the relations RCC2 are more causal than the relations RCO2 because of the same reason. Also note that the relations RCC1 and RCC2 correspond to the correlation-suppressing relations shown in FIG. 1 when the DOE system is configured to predict wafer properties of the panel Panel-1.

After completing the correlation processing procedure, effects from external noises on the relations RCO1 (or RCC1) and RCO2 (or RCC2) and internal noises outside three standard deviations of the outputs corresponding to the wafer design variables WYD are going to be processed in the following causality procedure; and it indicates the primary purpose of the causality procedure, as indicated by the above-mentioned step (e). After completing the step (e), the causality of the relations RCC1 and RCC2 can be raised so that the precision of the relations RCC1 and RCC2 are raised.

Figure 5:
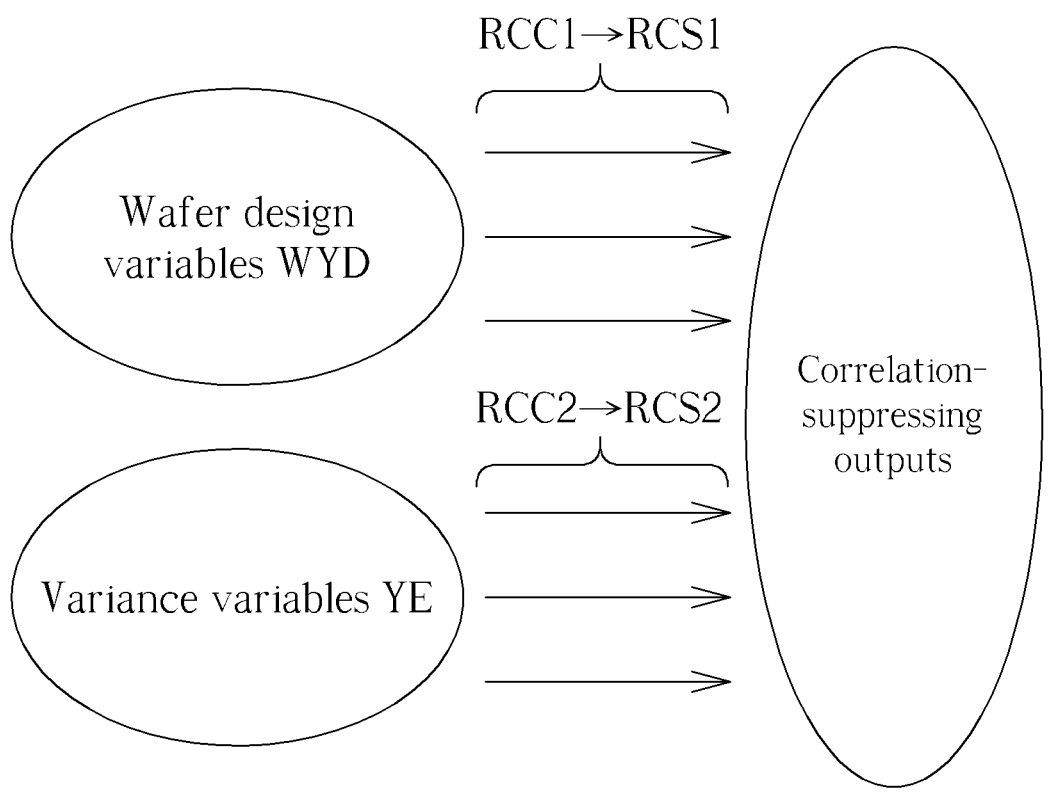

Please refer to FIG. 5, which schematically illustrates relations RCC1 (or RCS1) between the plurality of wafer design variables WYD and the plurality of outputs and relations RCC2 (or RCS2) between the plurality of variance variables YE for each of the plurality of wafer design variables WYD, in view of sets and mapping between sets for explaining a causality procedure in the disclosed DOE method. By using DOE techniques, a first set of relations RCS1 between the wafer design variables WYD and the correlation-suppressing outputs can be determined, and a second set of relations RCS2 between the wafer design variables WYD and the correlation-suppressing outputs can be determined as well. The relations RCS1 are more causal than the relations RCC1 since the external noises and the internal noises related to outside three standard deviations of the correlation outputs are all significantly reduced. Similarly, the relations RCS2 are more causal than the relations RCC2. Therefore, the relations RCS1 and RCS2 can be used for precisely predicting wafer outcomes as a wafer fabrication outcome predicting model for predicting wafer fabrication outcomes, such as wafer yield or wafer lifetime, without introducing the above-mentioned internal noises and external noises of the wafer processing unit, i.e., being immune from the effects from internal uncontrollable variables and external uncontrollable variables. Note that the relations RCS1 and RCS2 correspond to the causality relations shown in FIG. 1 when the DOE system is configured to predict wafer properties of the panel Panel-1.

The number and the types of factors for each wafer design variables WYD can be variable so that the DOE-based model 100 is not limited to be cubic in other embodiments of the present invention.

Figure 6:
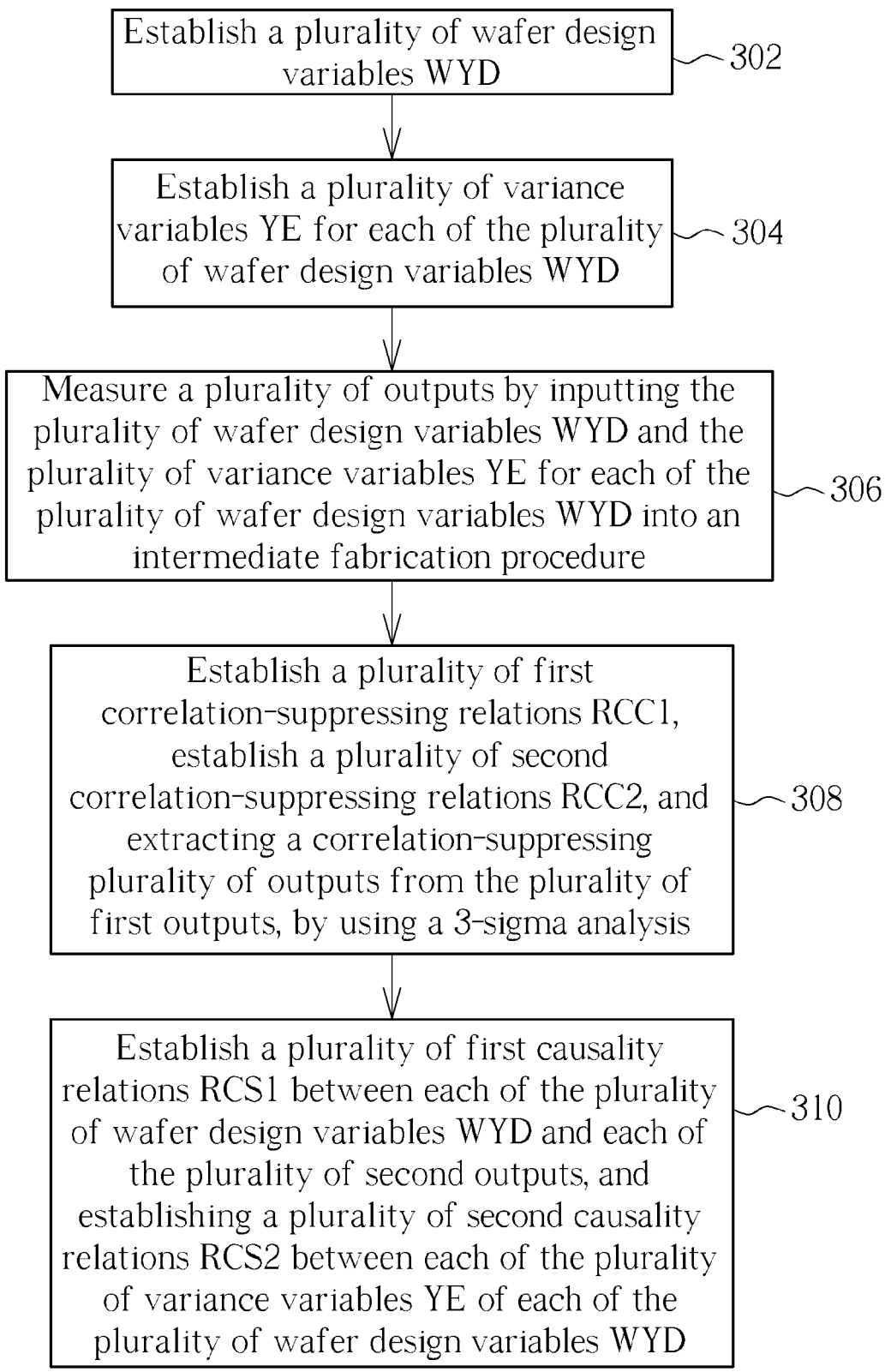
FIG. 6 illustrates the DOE method for predicting wafer properties according to the embodiment shown in FIGS. 1-5.

Please refer to FIG. 6, which illustrates the DOE method for predicting wafer properties according to the embodiment shown in FIGS. 1-5. FIG. 6 illustrates steps as follows:

Step 302: Establish a plurality of wafer design variables WYD of a DOE system under a first fabrication domain;

Step 304: Establish a plurality of variance variables YE for each of the plurality of wafer design variables WYD under the first fabrication domain;

Step 306: Measure a plurality of first outputs by inputting the plurality of wafer design variables WYD and the plurality of variance variables YE for each of the plurality of wafer design variables WYD into an intermediate fabrication procedure, where the intermediate fabrication procedure has the first fabrication domain as its input domain, and has a second fabrication domain as its range so that the plurality of first outputs lies in the second fabrication domain;

Step 308: Establish a plurality of first correlation-suppressing relations RCC1 between each of the plurality of design variables WYD and each of the plurality of first outputs, establish a plurality of second correlation-suppressing relations RCC2 between each of the plurality of variance variables YE for each of the plurality of design variables WYD and each of the plurality of first outputs, and extracting a correlation-suppressing plurality of second outputs from the plurality of first outputs, by using a 3-sigma analysis;

Step 310: Establish a plurality of first causality relations RCS1 between each of the plurality of wafer design variables WYD and each of the plurality of second outputs, and establishing a plurality of second causality relations RCS2 between each of the plurality of variance variables YE of each of the plurality of wafer design variables WYD.

Note that embodiments formed by adding limitations in the above descriptions or by reasonably combining and permuting of the steps illustrated in FIG. 6 should also be regarded as embodiments of the present invention.

The present invention discloses a DOE-based method for predicting a wafer fabrication outcome, such as wafer yield or wafer lifetime, by excluding uncontrollable but measurable internal/external noises of the DOE system, and by rendering relations between wafer design variables and wafer outcome outputs to be more causal, as well as the relations between variances for each of the wafer design variables and the wafer outcome outputs. With the aid of a wafer fabrication outcome predicting model formed by the more causal relations, precision of predicting wafer outcomes can be raised, and performance of wafer fabrication can be thus raised as a result.

Those skilled in the art will readily observe that numerous modifications and alterations of the device and method may be made while retaining the teachings of the invention.

What is claimed is:

1. A design of experiments (DOE) method for predicting a wafer fabrication outcome comprising:

establishing a plurality of wafer design variables of the DOE system under a first fabrication domain;

establishing a plurality of variances for each of the plurality of wafer design variables under the first fabrication domain;

establishing a plurality of first correlation-suppressing relations between each of a plurality of design variables and each of a plurality of first outputs, establishing a plurality of second correlation-suppressing relations between each of a plurality of variances of each of the plurality of design variables and each of the plurality of first outputs, and extracting a correlation-suppressing plurality of second outputs from the plurality of first outputs, by using a 3-sigma analysis; and establishing a plurality of first causality relations between each of the plurality of wafer design variables and each of the plurality of second outputs, and establishing a plurality of second causality relations between each of the plurality of variances of each of the plurality of wafer design variables and each of the plurality of second outputs;

wherein both the plurality of first outputs and the plurality of second outputs are utilized for indicating wafer fabrication outcomes of a DOE system, and both the plurality of first causality relations and the plurality of second causality relations are utilized for predicting a wafer fabrication outcome.

2. The DOE method of claim 1 wherein the plurality of wafer design variables comprise parameters utilized by the DOE system in fabricating wafers.

3. The DOE method of claim 1 wherein the plurality of variances for each of the plurality of wafer design variables comprise uncontrollable but measurable errors of parameters utilized by the DOE system in fabricating wafers.

4. The DOE method of claim 3 wherein the uncontrollable but measurable errors comprise internal errors of the DOE system and external errors of the DOE system.

5. The DOE method of claim 1 further comprising:
measuring the plurality of first outputs belonging to a second fabrication domain by inputting the plurality of wafer design variables and the plurality of variances for each of the plurality of wafer design variables into an intermediate fabrication procedure, wherein the intermediate fabrication procedure has the first fabrication domain as its input domain, and has the second fabrication domain as its output domain.

6. The DOE method of claim 5 wherein the first fabrication domain is prior to the second fabrication domain within a whole wafer fabrication procedure of the DOE system.

7. The DOE method of claim 5 wherein each of the plurality of wafer design variables is a multi-dimensional variable, dimensions of which indicates factors of the first fabrication domain.

8. The DOE method of claim 5 wherein the plurality of first outputs and the plurality of second outputs indicate wafer yield or wafer lifetime.

9. The DOE method of claim 1 wherein the 3-sigma analysis comprises a principal component analysis (PCA) or a partial least square (PLS) analysis.

* * * * *